(12) United States Patent
Tseng

(10) Patent No.: US 6,638,794 B2
(45) Date of Patent: Oct. 28, 2003

(54) METHOD FOR FABRICATING AN ANTI-FUSE IN PROGRAMMABLE INTERCONNECTIONS

(75) Inventor: Horng-Huei Tseng, Hsin-Chu (TW)

(73) Assignee: Vanguard International Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/217,688

(22) Filed: Aug. 12, 2002

(65) Prior Publication Data

US 2003/0129819 A1 Jul. 10, 2003

Related U.S. Application Data

(63) Continuation-in-part of application No. 10/039,058, filed on Jan. 4, 2002, now abandoned.

(51) Int. Cl.[7] .............................................. H01L 21/82
(52) U.S. Cl. ...................... 438/128; 438/131; 438/600; 438/467
(58) Field of Search ................................ 438/128, 130, 438/131, 466, 467, 600

(56) References Cited

U.S. PATENT DOCUMENTS

| | | | | |
|---|---|---|---|---|
| 5,447,880 A | * | 9/1995 | Lee et al. ................... | 438/600 |
| 5,789,764 A | * | 8/1998 | McCollum ................... | 257/76 |
| 6,025,226 A | * | 2/2000 | Gambino et al. ............ | 438/244 |
| 6,335,228 B1 | * | 1/2002 | Fuller et al. ................ | 438/131 |
| 6,387,792 B2 | * | 5/2002 | Lehr et al. .................. | 438/600 |
| 6,458,631 B1 | * | 10/2002 | Brintzinger et al. ........ | 438/131 |
| 2003/0036254 A1 | * | 2/2003 | Dennison .................... | 438/600 |

* cited by examiner

*Primary Examiner*—Tuan H. Nguyen
(74) *Attorney, Agent, or Firm*—Clement Cheng

(57) ABSTRACT

The present invention includes forming a first conductive layer in a first dielectric layer, followed by forming a second dielectric layer on the first dielectric layer. The second dielectric layer is patterned to form openings on the second dielectric layer, a patterned photoresist is used as a mask to etch holes on the bottom of openings through the second dielectric layer to expose the surface of the first conductive layer 4, and an anti-fuse layer is formed on the second dielectric layer and on a surface of the holes. A photoresist is formed on the anti-fuse layer to expose un-programmable area, followed by plasma etching the anti-fuse layer on the un-programmable area using the photoresist as mask to expose the first conductive layer on the un-programmable area. The photoresist is removed. A second conductive layer is formed on the anti-fuse layer and refilling into the holes. A planarization process is performed by chemical mechanical polishing to polish the second conductive layer to form a programmable anti-fuse.

9 Claims, 4 Drawing Sheets

METHOD FOR FABRICATING AN ANTI-FUSE IN PROGRAMMABLE INTERCONNECTIONS

CROSS-REFERENCE TO RELATED APPLICATIONS

This application is a continuation-in-part of, and claims priority under 35 U.S.C. §120 from, U.S. patent application Ser. No. 10/039,058, filed Jan. 4, 2002, and entitled "METHOD FOR FABRICATING AN ANTI-FUSE IN PROGRAMMABLE INTERCONNECTIONS", now abandoned.

TECHNICAL FIELD

The present invention generally relates to a method of a fabricating a semiconductor device, and more particularly to a method of fabricating an anti-fuse in programmable interconnections.

BACKGROUND

With the rapid development of integrated circuit technologies, there has been a trend to reduce the scale of a device. Thus, semiconductor technologies have increased the integrated circuit density on a chip. The semiconductor devices manufactured in and on the semiconductor substrate are very closely spaced. The alignment, lithography technologies are more important than ever due to the density of the packing density is continuously increased. During the formation of the ICs, programmable devices are typically formed on a certain area for replacing the element having defects. For example, the programmable device is employed to replace the defected DRAM. The programmable device is typically consisted of a selecting transistor and an anti-fuse. The selecting transistor may select the anti-fuse that wish to be used and then the input voltage conducts the anti-fuse. One of the prior arts may refer to U.S. Pat. No. 6,040,608, entitled "Field Effect Transistor for One-Time Programmable Nonvolatite Memory Element."

Up to now, there are various ways to form the anti-fuse. One of the methods is to conduct the anti-fuse by biasing high voltage. Another method is to alter the conductivity of the anti-fuse by using laser. One of the articles may refer to IEEE, 38$^{th}$ Annual International Reliability Physics Symposium, 2000, page 169, "One Time Programmable Drift Anti-fuse Cell Reliability." Wherein the art disclosed that laser anti-fuse is one of the solutions for SRAM and DRAM redundancy. The un-programmed structure used to form the anti-fuse has an intrinsically high resistance, by applying a programmable current, the electrical resistance through the anti-fuse material is greatly reduced providing a conductive link between metallizations. Typical the anti-fuse materials include amorphous silicon, amorphous carbon, carbon, germanium and so on.

One of the arts related to an anti-fuse process that compatible with the CMOS process. Another further prior art includes NMOS connected to an anti-fuse, N-well is used to acts the drain of the NMOS. The programmable steps include selecting the anti-fuse by using the NMOS and providing lower power to the un-selected device, higher power biases to the selected device to breakdown the oxide. A further art may refer to the U.S. Pat. No. 6,251,710, entitled "Method of making a dual damascene anti-fuse with via before wire," assigned to IBM. The drawback of the prior art is that the anti-fuse material too thin about 20 to 150 angstrom and the dielectric is likely loss during the dielectric etching.

SUMMARY OF THE INVENTION

It is an object of the present invention to provide a method for fabricating an anti-fuse.

The present invention includes forming a first conductive layer in a first dielectric layer, followed by forming a second dielectric layer on the first dielectric layer. The second dielectric layer is patterned to form openings on the second dielectric layer, a patterned photoresist is used as a mask to etch holes on the bottom of openings through the second dielectric layer to expose the surface of the first conductive layer 4, then an anti-fuse layer is formed on the second dielectric layer and on a surface of the holes. A photoresist is formed on the anti-fuse layer to expose un-programmable area, followed by plasma etching the anti-fuse layer on the un-programmable area using the photoresist as mask to expose the first conductive layer on the un-programmable area. The photo resist is removed. A second conductive layer is formed on the anti-fuse layer and refilling into the holes. A planarization process is performed by chemical mechanical polishing to polish the second conductive layer to form a programmable anti-fuse.

The anti-fuse layer acts as a barrier to prevent metal atom from diffusion. Preferably, the anti-fuse layer is less than 50 angstroms. The anti-fuse layer comprises SiC, amorphous silicon, and silicon dioxide or silicon nitride.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE ILLUSTRATED EMBODIMENTS

Figure 1:
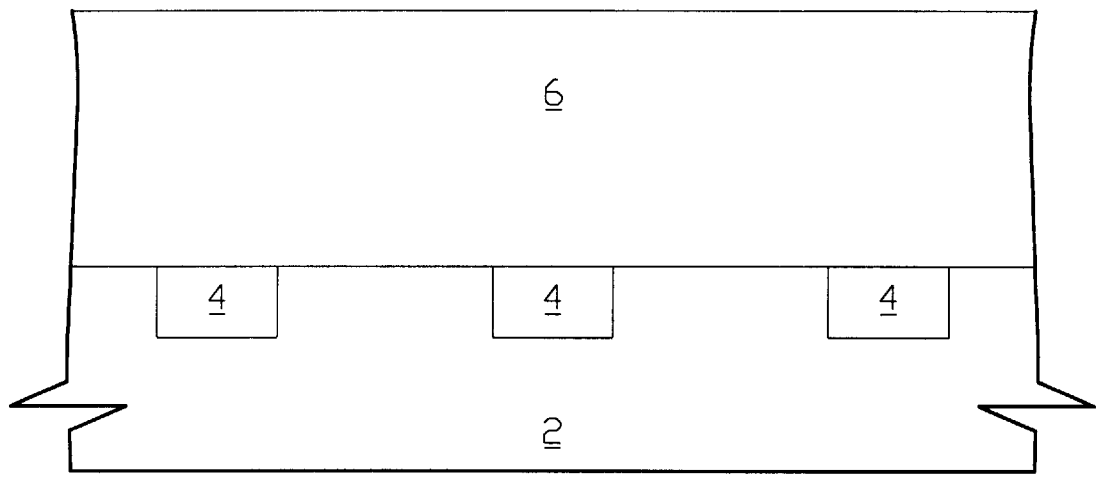
FIG. 1 is a cross section view of a semiconductor wafer illustrating the steps of forming first conductive layer and a second dielectric layer of the present invention.

The present invention will be described in detail with reference to the drawings. The present invention provides a novel method to fabricate an anti-fuse device. Now, referring to FIG. 1, a single crystal substrate is P-type or N-type with <100> crystallographic orientation. A dielectric layer 2 is provided on the substrate. A first conductive layer 4 is formed in the dielectric layer 2 by using conventional lithography and etching to form trenches in the dielectric layer 2, followed by refilling conductive material into the trench. Suitable material used in forming the first level of conductive feature in the dielectric layer 2 include but not limited to aluminum (Al), tungsten (W), copper (Cu), chromium (Cr), gold (Au), platinum (Pt) and alloys combination thereof.

Figure 2:
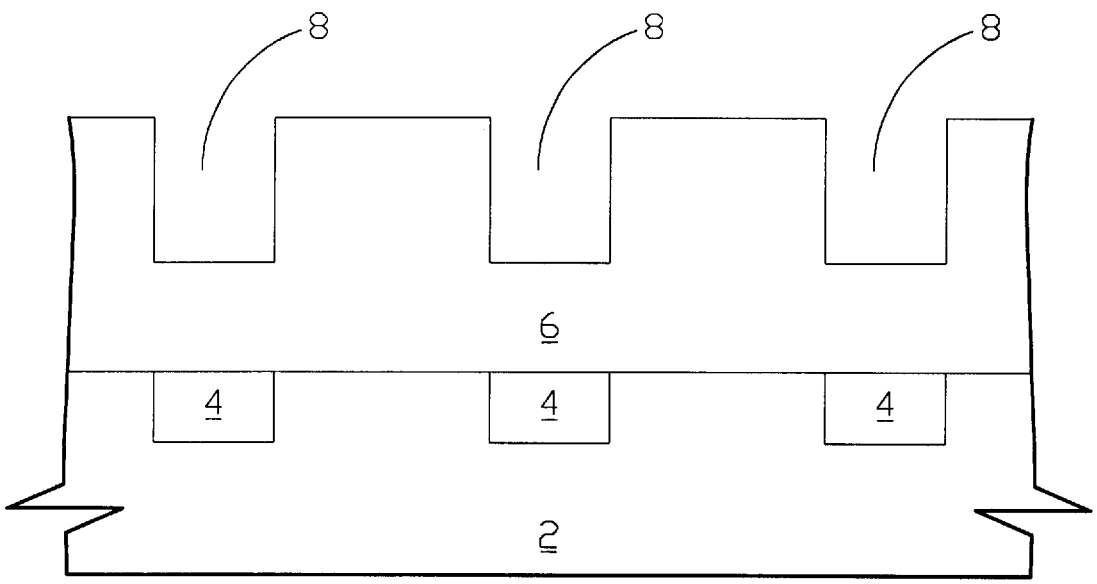
FIG. 2 is a cross section view of a semiconductor wafer illustrating the step of forming an opening on the second dielectric layer of the present invention.

A second dielectric layer 6 is formed on the first dielectric layer 2, and openings 8 are formed in a conventional manner as shown in FIG. 2. In the embodiment, oxide can be used as the dielectric layer and formed by using a chemical vapor deposition and TEOS as the reaction source.

Figure 3:
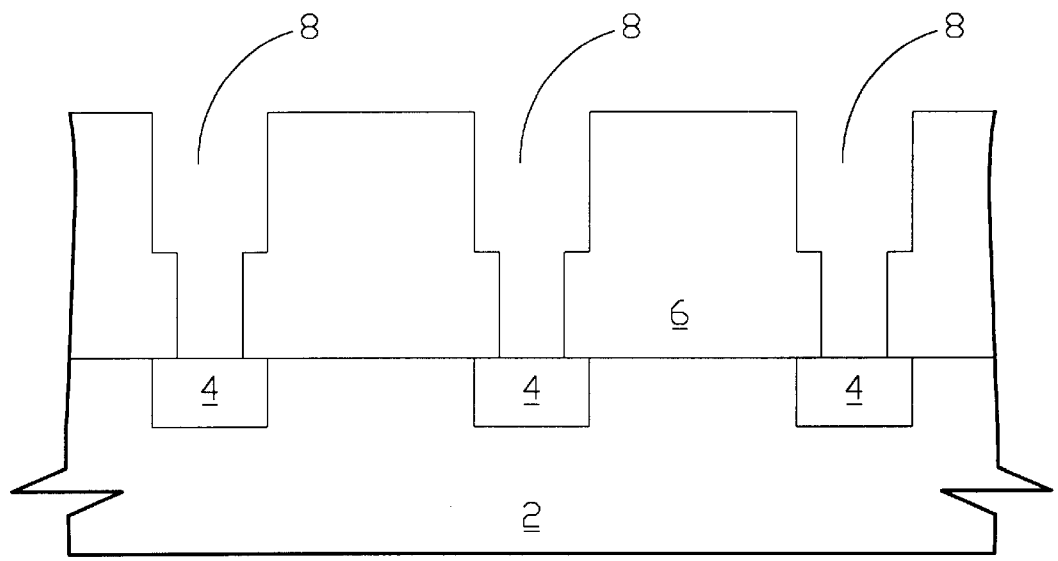
FIG. 3 is a cross section view of a semiconductor wafer illustrating the step of forming a dual damascene structure.
Figure 4:
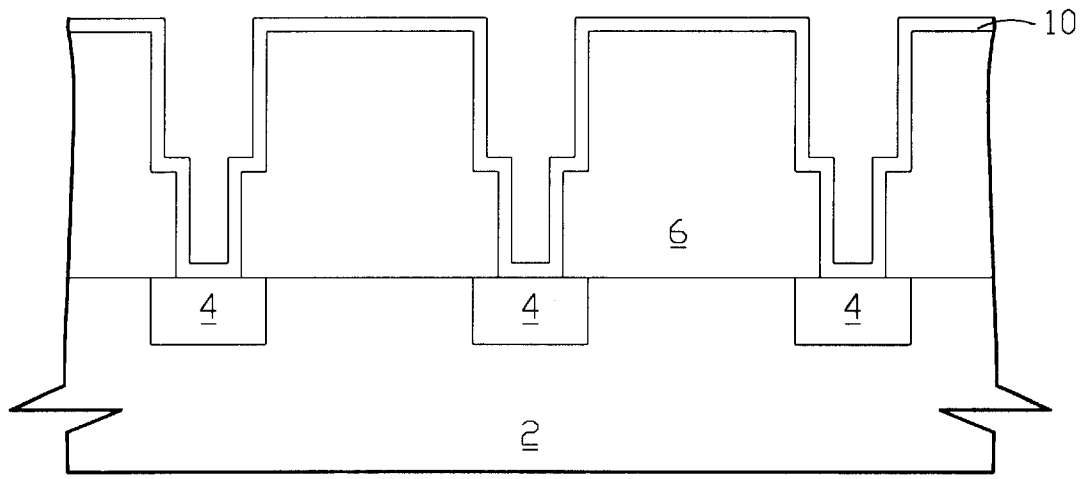
FIG. 4 is a cross section view of a semiconductor wafer illustrating the step of forming an anti-fuse layer according to the present invention.

Next, as shown in FIG. 3, a patterned photoresist (not shown) is used as a mask to etch holes on the bottom of openings 8 through the second dielectric layer 6 to expose the surface of the first conductive layer 4. Thus, a dual damascene structure is formed, with the width of the holes being smaller than the width of the openings. Then, an anti-fuse material 10 is formed on the etched surface as shown in FIG. 4.

Figure 5:
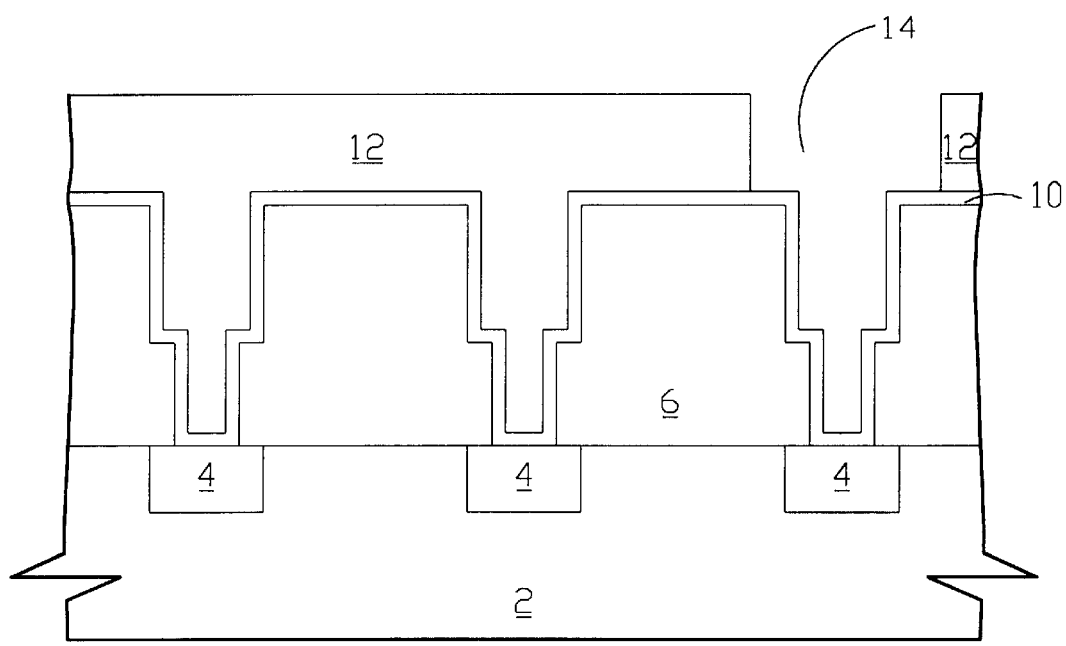
FIG. 5 is a cross section view of a semiconductor wafer illustrating the step of etching the anti-fuse layer according to the present invention.
Figure 6:
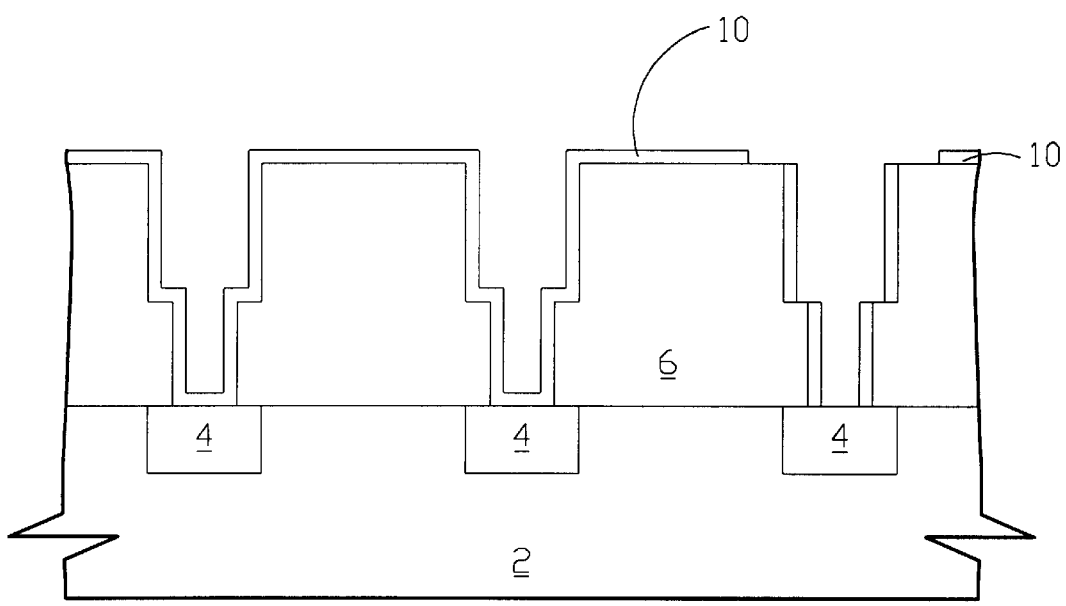
FIG. 6 is a cross section view of a semiconductor wafer illustrating the step of removing the photoresist.

As shown in FIG. 5, a photoresist 12 is patterned on the second dielectric layer 6 to form an opening 14 to expose the un-programmable area. Turning to FIG. 6, an etching process is used to etch the anti-fuse material 10 to expose the conductive layer 4 on the un-programmable area. The etched un-programmable area has a better profile than that of the prior art due to a wider upper and a narrow lower structure and shape of the dual damascene region. Therefore, the anti-fuse material 10 on the bottom of un-programmable area is efficiently etched with a better profile, thus proceeding to the next process, the photoresist 12 is removed. The material for the anti-fuse material includes but not limited to amorphous silicon, amorphous carbon, oxide, SiC and nitride. The conductive layer 4 on the un-programmable area will be linked to another conductive layer by the subsequent steps.

Figure 7:
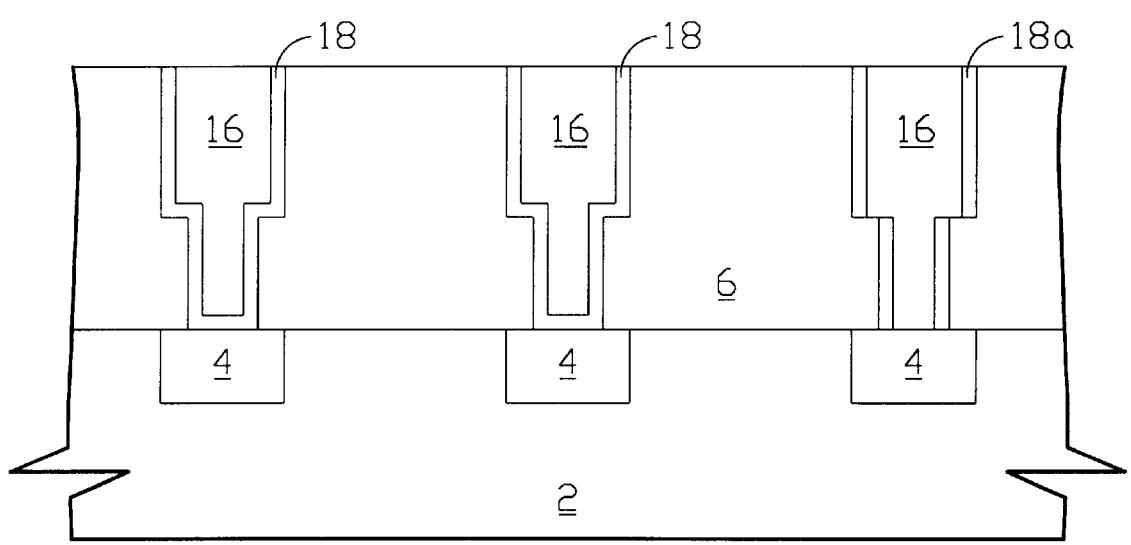
FIG. 7 is a cross section view of a semiconductor wafer illustrating the step of forming a second conductive layer according to the present invention.

Turning to FIG. 7, a conductive layer 16 is formed on the second dielectric layer 6 and refilled into the trench. Chemical mechanical polishing is introduced to polish the surface of the conductive layer 16 to the second dielectric layer 6 for planarization. Programmable anti-fuse 18 and un-programmable device 18a are formed. The conductive layer 16 can be metal, alloy or polysilicon.

The present anti-fuse material is thin and the dielectric layer etching is prior to the anti-fuse material formation. Thus, lower current is required to conduct the anti-fuse and no dielectric will be loss. Further, the anti-fuse material acts the barrier to prevent the metal atom diffusion. For example, if the conductive layer is copper, the anti-fuse material may prevent the copper atom from diffusing. The thickness of the anti-fuse material 10 is about 20–150 angstrom, preferably, less than 50 angstroms. The present invention is compatible to the copper process.

As is understood by a person skilled in the art, the forgoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modification and similar structure.

What is claimed is:

1. A method for forming an anti-fuse in programmable metal interconnection said method comprising the steps of:
   forming a first conductive layer in a first dielectric layer;
   forming a second dielectric layer on said first dielectric layer;
   patterning said second dielectric layer to form openings;
   patterning bottom of said openings to form holes to expose surface of said first conductive layer, wherein the width of said hole is smaller than the width of said openings;
   forming an anti-fuse layer on said second dielectric layer and on a surface of said holes;
   forming a photoresist on said anti-fuse layer to expose a un-programmable area;
   etching said anti-fuse layer on said un-programmable area using said photoresist as mask to expose said first conductive layer on said un-programmable area;
   removing said photoresist;
   forming a second conductive layer on said anti-fuse layer and refilling into said holes; and
   performing a planarization to polish said second conductive layer to form a programmable metal interconnection with anti-fuse.

2. The method of claim 1 wherein the etching of said anti-fuse comprises plasma etching.

3. The method of claim 1 wherein said planarization comprises chemical polishing.

4. The method of claim 1 wherein said anti-fuse layer acts as a barrier to prevent metal atom from diffusion.

5. The method of claim 1 wherein the thickness of said anti-fuse layer is less than 50 angstroms.

6. The method of claim 1 wherein said anti-fuse layer comprises SiC.

7. The method of claim 1 wherein said anti-fuse layer comprises amorphous silicon.

8. The method of claim 1 wherein said anti-fuse layer comprises silicon dioxide.

9. The method of claim 1 wherein said anti-fuse layer comprises silicon nitride.

* * * * *